(12) United States Patent
Kawahara

(10) Patent No.: US 10,695,841 B2
(45) Date of Patent: Jun. 30, 2020

(54) COATED CUTTING TOOL

(71) Applicant: TUNGALOY CORPORATION, Fukushima (JP)

(72) Inventor: Keiya Kawahara, Iwaki (JP)

(73) Assignee: TUNGALOY CORPORATION, Iwaki-shi, Fukushima (JP)

( * ) Notice: Subject to any disclaimer, the term of this patent is extended or adjusted under 35 U.S.C. 154(b) by 169 days.

(21) Appl. No.: 15/898,446

(22) Filed: Feb. 17, 2018

(65) Prior Publication Data

US 2018/0236564 A1 Aug. 23, 2018

(30) Foreign Application Priority Data

Feb. 20, 2017 (JP) .................. 2017-028856

(51) Int. Cl.
| | |
|---|---|
| B23B 27/14 | (2006.01) |
| B23C 5/20 | (2006.01) |
| C23C 16/40 | (2006.01) |
| C23C 28/04 | (2006.01) |
| C23C 30/00 | (2006.01) |
| C23C 16/56 | (2006.01) |
| C23C 16/34 | (2006.01) |
| C23C 16/30 | (2006.01) |
| C23C 16/36 | (2006.01) |
| C23C 16/02 | (2006.01) |
| C30B 25/00 | (2006.01) |

(52) U.S. Cl.
CPC ............ *B23B 27/148* (2013.01); *B23C 5/20* (2013.01); *C23C 16/0272* (2013.01); *C23C 16/30* (2013.01); *C23C 16/308* (2013.01); *C23C 16/34* (2013.01); *C23C 16/36* (2013.01); *C23C 16/403* (2013.01); *C23C 16/56* (2013.01); *C23C 28/044* (2013.01); *C23C 30/00* (2013.01); *C23C 30/005* (2013.01); *C30B 25/00* (2013.01)

(58) Field of Classification Search
USPC .......... 51/307, 309; 428/216, 336, 698, 701, 428/702
See application file for complete search history.

(56) References Cited

U.S. PATENT DOCUMENTS

| | | | | |
|---|---|---|---|---|
| 5,863,640 A | * | 1/1999 | Ljungberg | .............. C22C 29/08 51/309 |
| 7,135,221 B2 | * | 11/2006 | Ruppi | ..................... C22C 29/08 428/336 |
| 2008/0292905 A1 | * | 11/2008 | Okada | ..................... C23C 16/56 428/702 |

(Continued)

FOREIGN PATENT DOCUMENTS

| | | |
|---|---|---|
| CN | 103987875 A | 8/2014 |
| JP | 2014-530112 A | 11/2014 |

*Primary Examiner* — Archene A Turner
(74) *Attorney, Agent, or Firm* — Studebaker & Brackett PC

(57) ABSTRACT

A coated cutting tool comprising a substrate and a coating layer formed on a surface of the substrate, the coating layer including at least one α-type aluminum oxide layer, wherein: in the α-type aluminum oxide layer, a texture coefficient TC (0,0,12) of a (0,0,12) plane falls within a predetermined range; a residual stress value in a (1,1,6) plane of the α-type aluminum oxide layer falls, at least in part thereof, within a predetermined range; and a residual stress value in a (4,0,10) plane of the α-type aluminum oxide layer falls, at least in part thereof, within a predetermined range.

14 Claims, 1 Drawing Sheet

(56) References Cited

U.S. PATENT DOCUMENTS

| | | | |
|---|---|---|---|
| 2011/0045283 A1* | 2/2011 | Holzschuh | C23C 16/56 428/336 |
| 2014/0193624 A1 | 7/2014 | Stiens et al. | |
| 2016/0175940 A1* | 6/2016 | Lindahl | B23B 27/148 428/141 |
| 2016/0263659 A1* | 9/2016 | Takahashi | C23C 16/403 |

* cited by examiner

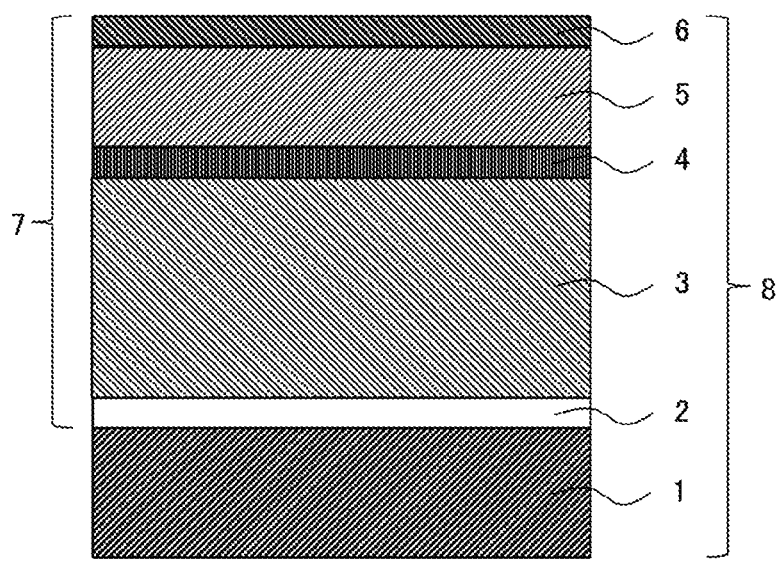

COATED CUTTING TOOL

TECHNICAL FIELD

The present invention relates to a coated cutting tool.

BACKGROUND ART

It has been conventionally well known to employ, for the cutting of steel, cast iron, etc., a coated cutting tool which is obtained by depositing, via chemical vapor deposition, a coating layer with a total thickness of from 3 μm or more to 20 μm or less on a surface of a substrate consisting of a cemented carbide. A known example of the above coating layer is a coating layer consisting of a single layer of one kind selected from the group consisting of a Ti carbide, a Ti nitride, a Ti carbonitride, a Ti carboxide, a Ti carboxynitride, and aluminum oxide, or consisting of multiple layers of two or more kinds selected therefrom.

For example, JP2014-530112 T discloses a cutting insert comprising, on a surface of a substrate, hard coating layers, wherein: at least one of the hard coating layers is an α-$Al_2O_3$ layer; in the α-$Al_2O_3$ layer, a texture coefficient TC (0012) thereof represented by formula (I) below is 5 or more; a residual stress (an inherent stress in a region) of the α-$Al_2O_3$ layer is from 0 MPa or higher to 300 MPa or lower; and a minimum value of a residual stress (an inherent stress in a region) of the substrate which is located within a predetermined range from the surface of the substrate is from −2,000 MPa or higher to −400 MPa or lower.

SUMMARY OF THE INVENTION

Technical Problem

An increase in speed, feed and depth of cut have become more conspicuous in cutting in recent times. As a result, a tool may often fracture due to either of the following points: cracking generated from a tool surface due to a load applied onto an edge during machining reaching toward a substrate; or cracking generated from a substrate due to a rapid increase/decrease in edge temperature reaching into a coating layer.

Based on such background, the tool disclosed in Patent Document 1 has excellent wear resistance but has insufficient fracture resistance under cutting conditions which place a large load on a coated cutting tool, and the life thereof is therefore required to be further improved.

The present invention has been made in order to solve this problem, and an object of the present invention is to provide a coated cutting tool which has excellent wear resistance and fracture resistance and which accordingly has a long tool life.

Solution to Problem

The present inventor has conducted studies regarding extending the tool life of a coated cutting tool from the above-described perspective and has then found that the following configurations, including optimizing the crystal orientation in a predetermined plane of an α-type aluminum oxide layer and setting the residual stress of the α-type aluminum oxide layer at a predetermined value, allow the wear resistance to be improved, and also allow the fracture resistance to be improved as the progress of cracking is suppressed, and found that, as a result, the tool life of the coated cutting tool can be extended, and this has led to the completion of the present invention.

Namely, the present invention is as set forth below:

[1] A coated cutting tool comprising a substrate and a coating layer formed on a surface of the substrate, the coating layer including at least one α-type aluminum oxide layer, wherein:

in the α-type aluminum oxide layer, a texture coefficient TC (0,0,12) of a (0,0,12) plane represented by formula (1) below is from 4.0 or more to 8.4 or less;

a residual stress value in a (1,1,6) plane of the α-type aluminum oxide layer is, at least in part thereof, from −800 MPa or higher to 100 MPa or lower; and a residual stress value in a (4,0,10) plane of the α-type aluminum oxide layer is, at least in part thereof, from 0 MPa or higher to 300 MPa or lower.

$$TC(0, 0, 12) = \frac{I(0, 0, 12)}{I_0(0, 0, 12)} \left\{ \frac{1}{9} \sum \frac{I(h, k, l)}{I_0(h, k, l)} \right\}^{-1} \quad (1)$$

(In formula (1), I (h,k,l) denotes a peak intensity for an (h,k,l) plane in X-ray diffraction of the α-type aluminum oxide layer, $I_0$ (h,k,l) denotes a standard diffraction intensity for an (h,k,l) plane which is indicated on a JCPDS Card No. 10-0173 for α-type aluminum oxide, and (h,k,l) refers to nine crystal planes of (0,1,2), (1,0,4), (1,1,0), (1,1,3), (1,1,6), (0,1,8), (2,1,4), (3,0,0) and (0,0,12).)

[2] The coated cutting tool according to [1], wherein the coating layer comprises a titanium carbonitride layer between the substrate and the α-type aluminum oxide layer.

[3] The coated cutting tool according to [2], wherein the coating layer satisfies a condition represented by formula (A) below.

$$0 \leq |S1-S2| \leq 400 \quad (A)$$

(In formula (A), S1 denotes a residual stress value (unit: MPa) in a (4,0,10) plane of the α-type aluminum oxide layer, and S2 denotes to a residual stress value (unit: MPa) in a (4,2,2) of the titanium carbonitride layer.)

[4] The coated cutting tool according to [2] or [3], wherein a residual stress value in a (4,2,2) plane of the titanium carbonitride layer is, in at least part thereof, from 0 MPa or higher to 400 MPa or lower.

[5] The coated cutting tool according to any of [2] to [4], wherein an average thickness of the titanium carbonitride layer is from 1.0 μm or more to 20.0 μm or less.

[6] The coated cutting tool according to any of [2] to [5], wherein the coating layer comprises, between the titanium carbonitride layer and the α-type aluminum oxide layer, an intermediate layer comprising a compound of at least one kind selected from the group consisting of a Ti carboxide, a Ti oxynitride and a Ti carboxynitride.

[7] The coated cutting tool according to [6], wherein an average thickness of the intermediate layer is from 0.1 μm or more to 1.5 μm or less.

[8] The coated cutting tool according to any of [1] to [7], wherein, in the α-type aluminum oxide layer, the texture coefficient TC (0,0,12) is from 5.0 or more to 8.2 or less.

[9] The coated cutting tool according to any of [1] to [8], wherein a residual stress value in a (1,1,6) plane of the α-type aluminum oxide layer is, in at least part thereof, from −600 MPa or higher to −300 MPa or lower.

[10] The coated cutting tool according to any of [1] to [9], wherein a residual stress value in a (4,0,10) plane of the α-type aluminum oxide layer is, in at least part thereof, from 0 MPa or higher to 200 MPa or lower.

[11] The coated cutting tool according to any of [1] to [10], wherein an average thickness of the α-type aluminum oxide layer is from 1.0 μm or more to 15.0 μm or less.

[12] The coated cutting tool according to any of [1] to [11], wherein an average thickness of the coating layer is from 3.0 μm or more to 30.0 μm or less.

[13] The coated cutting tool according to any of [1] to [12], wherein the coating layer comprises a TiN layer as an outermost layer on the α-type aluminum oxide layer.

[14] The coated cutting tool according to any of [1] to [13], wherein the substrate is comprised of any of a cemented carbide, cermet, ceramics and a sintered body containing cubic boron nitride.

The present invention can provide a coated cutting tool which has excellent wear resistance and fracture resistance and thereby allows the tool life to be extended.

BRIEF DESCRIPTION OF DRAWINGS

The FIGURE is a schematic view showing an example of a coated cutting tool according to the present invention.

DESCRIPTION OF EMBODIMENTS

An embodiment for carrying out the present invention (hereinafter simply referred to as the "present embodiment") will hereinafter be described in detail. However, the present invention is not limited to the present embodiment below. Various modifications may be made to the present invention without departing from the gist of the invention.

A coated cutting tool according to the present invention is a coated cutting tool comprising a substrate and a coating layer formed on a surface of the substrate, the coating layer including at least one α-type aluminum oxide layer, wherein: in the α-type aluminum oxide layer, a texture coefficient TC (0,0,12) of a (0,0,12) plane represented by formula (1) below is from 4.0 or more to 8.4 or less; a residual stress value in a (1,1,6) plane of the α-type aluminum oxide layer is, at least in part thereof, from −800 MPa or higher to 100 MPa or lower; and a residual stress value in a (4,0,10) plane of the α-type aluminum oxide layer is, at least in part thereof, from 0 MPa or higher to 300 MPa or lower.

$$TC(0, 0, 12) = \frac{I(0, 0, 12)}{I_0(0, 0, 12)} \left\{ \frac{1}{9} \sum \frac{I(h, k, l)}{I_0(h, k, l)} \right\}^{-1} \quad (1)$$

(In formula (1), I (h,k,l) denotes a peak intensity for an (h,k,l) plane in X-ray diffraction of the α-type aluminum oxide layer, $I_0$ (h,k,l) denotes a standard diffraction intensity for an (h,k,l) plane which is indicated on a JCPDS Card No. 10-0173 for α-type aluminum oxide, and (h,k,l) refers to nine crystal planes of (0,1,2), (1,0,4), (1,1,0), (1,1,3), (1,1,6), (0,1,8), (2,1,4), (3,0,0) and (0,0,12).)

The coated cutting tool of the present embodiment comprises the above-described configurations, and this allows the wear resistance and fracture resistance of the coated cutting tool to be improved; as a result, the tool life of the coated cutting tool can be extended. The factors for the improvements in wear resistance and fracture resistance of the coated cutting tool of the present embodiment can be considered to be set forth as follows. However, the present invention is not limited, in any way, by the factors set forth below.

(1) In the α-type aluminum oxide layer, the texture coefficient TC (0,0,12) of the (0,0,12) plane represented by formula (1) is 4.0 or more, and this leads to an increased ratio of a peak intensity I (0,0,12) of the (0,0,12) plane. This suppresses the falling of particles, thereby resulting in excellent wear resistance. Meanwhile, in terms of manufacturing, it is difficult for the texture coefficient TC (0,0,12) of the (0,0,12) plane represented by formula (1) to be over 8.4.

(2) The residual stress value in the (1,1,6) plane of the α-type aluminum oxide layer is from −800 MPa or higher to 100 MPa or lower. The residual stress value in the (1,1,6) plane can be considered to refer to a surface-side residual stress of the α-type aluminum oxide layer. The residual stress value in the (1,1,6) plane of the α-type aluminum oxide layer is, at least in part thereof, −800 MPa or higher, and this can suppress the progress of wear which starts from the time when particles fall off from the α-type aluminum oxide layer (in particular, a part of the α-type aluminum oxide layer which is closer to a surface thereof), thereby resulting in excellent wear resistance. Meanwhile, the residual stress value in the (1,1,6) plane of the α-type aluminum oxide layer is, at least in part thereof, 100 MPa or lower, and this can suppress the generation of cracking in the α-type aluminum oxide layer (in particular, the part of the α-type aluminum oxide layer which is closer to a surface thereof), thereby resulting in excellent fracture resistance.

(3) The residual stress value in the (4,0,10) plane of the α-type aluminum oxide layer is from 0 MPa or higher to 300 MPa or lower. The residual stress value in the (4,0,10) plane can be considered to refer to an inner-side residual stress of the α-type aluminum oxide layer. The residual stress value in the (4,0,10) plane of the α-type aluminum oxide layer is, at least in part thereof, 0 MPa or higher, and this can suppress the progress of wear which starts from the time when particles fall off from the α-type aluminum oxide layer (in particular, an inner-side part of the α-type aluminum oxide layer), thereby resulting in excellent wear resistance. Meanwhile, the residual stress value in the (4,0,10) plane of the α-type aluminum oxide layer is, at least in part thereof, 300 MPa or lower, and this can suppress the generation of cracking in the α-type aluminum oxide layer (in particular, the inner-side part of the α-type aluminum oxide layer), thereby resulting in excellent fracture resistance.

The FIGURE is a schematic cross-sectional view showing an example of a coated cutting tool of the present embodiment. A coated cutting tool 8 is provided with a substrate 1 and a coating layer 7 on a surface of the substrate 1, and the coating layer 7 is obtained by laminating, in an upward direction, a lowermost layer 2, a titanium carbonitride layer (TiCN layer) 3, an intermediate layer 4, an α-type aluminum oxide layer 5 and an outermost layer 6 in this order. Each of the layers which constitute the coating layer 7 will be described below.

A coated cutting tool according to the present embodiment comprises a substrate and a coating layer formed on the substrate. Specific examples of types of the coated cutting tool include an indexable cutting insert for milling or turning, a drill and an end mill.

The substrate in the present embodiment is not particularly limited, as long as it may be used as a substrate for the coated cutting tool. Examples of such substrate include a cemented carbide, cermet, ceramic, a sintered body containing cubic boron nitride, a diamond sintered body and high-speed steel. From among the above examples, the substrate is preferably comprised of any of a cemented carbide, cermet, ceramics and a sintered body containing cubic boron nitride, as this provides excellent wear resistance and fracture resistance, and, from the same perspective, the substrate is more preferably comprised of a cemented carbide.

It should be noted that the surface of the substrate may be modified. For instance, when the substrate is comprised of a cemented carbide, a β-free layer may be formed on the surface thereof, and when the substrate is comprised of cermet, a hardened layer may be formed on the surface thereof. The operation and effects of the present invention are still provided, even if the substrate surface has been modified in this way.

As to the coating layer in the present embodiment, the average thickness thereof is preferably from 3.0 μm or more to 30.0 μm or less. If the average thickness is 3.0 μm or more, this indicates the tendency of the wear resistance to be further improved, and if such average thickness is 30.0 μm or less, this indicates the tendency of the adhesion with the substrate of the coating layer and the fracture resistance to be further increased. From the same perspective, the average thickness of the coating layer is more preferably from 5.0 μm or more to 27.0 μm or less, is further preferably from 7.5 μm or more to 25.0 μm or less, and is particularly preferably from 8.0 μm or more to 23.5 μm or less. It should be noted that, as to the average thickness of each layer and the average thickness of the entire coating layer in the coated cutting tool of the present embodiment, each of such average thicknesses can be obtained by: measuring the thickness of each layer or the thickness of the entire coating layer from each of the cross-sectional surfaces at three or more locations in each layer or in the entire coating layer; and calculating the arithmetic mean of the resulting measurements.

(α-Type Aluminum Oxide Layer)

The coating layer in the present embodiment includes at least one α-type aluminum oxide layer. In the α-type aluminum oxide layer, a texture coefficient TC (0,0,12) of a (0,0,12) plane represented by formula (1) below is from 4.0 or more to 8.4 or less. When the texture coefficient TC (0,0,12) is 4.0 or more, the ratio of a peak intensity I (0,0,12) for the (0,0,12) plane is high, thereby resulting in excellent wear resistance as the falling of particles can be suppressed. In terms of manufacturing, it is difficult for the texture coefficient TC (0,0,12) to be over 8.4. From the same perspective, the texture coefficient TC (0,0,12) in the α-type aluminum oxide layer is preferably 4.5 or more, is more preferably 5.0 or more, and is further preferably 6.0 or more. Further, the texture coefficient TC (0,0,12) is preferably 8.2 or less, is more preferably 8.0 or less, and is further preferably 7.8 or less.

$$TC(0, 0, 12) = \frac{I(0, 0, 12)}{I_0(0, 0, 12)} \left\{ \frac{1}{9} \sum \frac{I(h, k, l)}{I_0(h, k, l)} \right\}^{-1} \quad (1)$$

Herein, in formula (1), I (h,k,l) denotes a peak intensity for an (h,k,l) plane in X-ray diffraction of the α-type aluminum oxide layer, $I_0$ (h,k,l) denotes a standard diffraction intensity for the (h,k,l) plane which is indicated on a JCPDS Card No. 10-0173 for α-type aluminum oxide, and (h,k,l) refers to nine crystal planes of (0,1,2), (1,0,4), (1,1,0), (1,1,3), (1,1,6), (0,1,8), (2,1,4), (3,0,0) and (0,0,12). Accordingly, I (0,0,12) denotes a peak intensity for the (0,0,12) plane in X-ray diffraction of the α-type aluminum oxide layer, and $I_0$ (0,0,12) denotes a standard diffraction intensity for the (0,0,12) plane which is indicated on a JCPDS Card No. 10-0173 for α-type aluminum oxide.

The average thickness of the α-type aluminum oxide layer of the present embodiment is preferably from 1.0 μm or more to 15.0 μm or less. If the average thickness of the α-type aluminum oxide layer is 1.0 μm or more, this indicates the tendency of the crater wear resistance in the rake surface of the coated cutting tool to be further improved, and if such average thickness is 15.0 μm or less, this indicates the tendency of the fracture resistance of the coated cutting tool to be further improved as the peeling of the coating layer is further suppressed. From the same perspective, the average thickness of the α-type aluminum oxide layer is preferably from 1.5 μm or more to 12.0 μm or less, and is further preferably from 3.0 μm or more to 10.0 μm or less.

In the present embodiment, the residual stress value in a (1,1,6) plane of the α-type aluminum oxide layer is, at least in part thereof, from −800 MPa or higher to 100 MPa or lower. If the residual stress value is −800 MPa or higher, this allows the wear resistance to be improved because the progress of wear—which starts from the time when particles fall off from the α-type aluminum oxide layer—can be suppressed. Further, if the residual stress value is 100 MPa or lower, this allows the fracture resistance of the coated cutting tool to be improved because the generation of cracking in the α-type aluminum oxide layer can be further suppressed. From the same perspective, the residual stress value in the (1,1,6) plane of the α-type aluminum oxide layer is further preferably from −600 MPa or higher to −300 MPa or lower.

Herein, the term "at least in part thereof" indicates that, it is not necessary to satisfy, in the entire α-type aluminum oxide layer, the above residual stress value range in the (1,1,6) plane of the α-type aluminum oxide layer, and such term also indicates that it is only required to satisfy the above residual stress value range in the (1,1,6) plane of the α-type aluminum oxide layer in a specific area such as a rake surface.

In the present embodiment, the residual stress value in a (4,0,10) plane of the α-type aluminum oxide layer is, at least in part thereof, from 0 MPa or higher to 300 MPa or lower. If the residual stress value is 0 MPa or higher, this allows the wear resistance to be improved because the progress of wear—which starts from the time when particles fall off from the α-type aluminum oxide layer—can be further suppressed. Further, if the residual stress value is 300 MPa or lower, this allows the fracture resistance of the coated cutting tool to be improved because the generation of cracking in the α-type aluminum oxide layer can be further suppressed. From the same perspective, the residual stress value in the (4,0,10) plane of the α-type aluminum oxide layer is further preferably from 0 MPa or higher to 200 MPa or lower.

Herein, the term "at least in part thereof" indicates that, it is not necessary to satisfy, in the entire α-type aluminum oxide layer, the above residual stress value range in the (4,0,10) plane of the α-type aluminum oxide layer, and such term also indicates that it is only required to satisfy the above residual stress value range in the (4,0,10) plane of the α-type aluminum oxide layer in a specific area such as a rake surface.

The residual stress value of the α-type aluminum oxide layer can be measured by a $\sin^2\varphi$ method using an X-ray stress measuring apparatus. It is preferable to measure, via the $\sin^2\varphi$ method, the residual stresses at any three points included in the coating layer and to obtain the arithmetic mean of the residual stresses at such three points. Any three points, serving as measurement locations, in the α-type aluminum oxide layer are preferably selected in such a way as to be 0.1 mm or more apart from one another.

In order to measure the residual stress value in the (1,1,6) plane of the α-type aluminum oxide layer, the (1,1,6) plane of the α-type aluminum oxide layer which serves as a measurement subject is selected for measurement. More specifically, a sample in which an α-type aluminum oxide layer is formed is subjected to analysis with an X-ray diffractometer. Then, an examination is conducted regarding variations in the diffraction angle of the (1,1,6) plane when a change is made to an angle φ formed by a sample plane normal and a lattice plane normal. The residual stress value in the (4,0,10) plane of the α-type aluminum oxide layer can be measured with the same method.

An X-ray angle of incidence differs depending on the crystal plane to be measured of an α-type aluminum oxide layer. The residual stress value measured with the selection of the (1,1,6) plane of the α-type aluminum oxide layer can be inferred to relatively refer to the front-side residual stress of the α-type aluminum oxide layer. The residual stress value when measurement was performed with the selection of the (4,0,10) plane of the α-type aluminum oxide layer can be inferred to relatively refer to the inner-side residual stress of the α-type aluminum oxide layer. However, the present invention is not limited, in any way, by the above inferences.

The α-type aluminum oxide layer is a layer comprised of α-type aluminum oxide. However, such α-type aluminum oxide layer may contain a very small amount of components other than α-type aluminum oxide, as long as it comprises the configuration of the present embodiment and provides the operation and effects of the present invention.

(Titanium Carbonitride Layer)

The coating layer of the present embodiment preferably comprises a titanium carbonitride layer (TiCN layer) between the substrate and the α-type aluminum oxide layer from the perspective of further improvement of wear resistance. The average thickness of the titanium carbonitride layer of the present embodiment is preferably from 1.0 μm or more to 20.0 μm or less. If the average thickness of the titanium carbonitride layer is 1.0 μm or more, this indicates the tendency of the wear resistance of the coated cutting tool to be further improved, and, if such average thickness is 20.0 μm or less, this indicates the tendency of the fracture resistance of the coated cutting tool to be further improved as the peeling of the coating layer is further suppressed. From the same perspective, the average thickness of the titanium carbonitride layer is more preferably from 5.0 μm or more to 15.0 μm or less.

In the present embodiment, the residual stress value in a (4,2,2) plane of the titanium carbonitride layer is, at least in part thereof, preferably from 0 MPa or higher to 400 MPa or lower. If the residual stress value is 0 MPa or higher, this indicates the tendency of the wear resistance to be further improved because the progress of wear—which starts from the time when particles fall off from the titanium carbonitride layer—can be further suppressed. Further, if the residual stress value is 400 MPa or lower, this indicates the tendency of the fracture resistance of the coated cutting tool to be further improved because the generation of cracking in the titanium carbonitride layer can be further suppressed. From the same perspective, the residual stress value in the (4,2,2) plane of the titanium carbonitride layer is more preferably from 0 MPa or higher to 350 MPa or lower.

Herein, the term "at least in part thereof" indicates that it is not necessary to satisfy, in the entire titanium carbonitride layer, the above residual stress value range in the (4,4,2) plane of the titanium carbonitride layer, and such term also indicates that it is only required to satisfy the above residual stress value range in the (4,4,2) plane of the titanium carbonitride layer in a specific area such as a rake surface.

The residual stress value of the titanium carbonitride layer can be measured by a $\sin^2\varphi$ method using an X-ray stress measuring apparatus. It is preferable to measure, via the $\sin^2\varphi$ method, the residual stresses at any three points included in the coating layer and to obtain the arithmetic mean of the residual stresses at such three points. Any three points, serving as measurement locations, in the titanium carbonitride layer are preferably selected in such a way as to be 0.1 mm or more apart from one another.

In order to measure the residual stress value in the (4,2,2) plane of the titanium carbonitride layer, the (4,2,2) plane of the titanium carbonitride layer which serves as a measurement subject is selected for measurement. More specifically, a sample in which a titanium carbonitride layer is formed is subjected to analysis with an X-ray diffractometer. Then, an examination is conducted regarding variations in the diffraction angle of the (4,2,2) plane when a change is made to an angle φ formed by a sample plane normal and a lattice plane normal.

The titanium carbonitride layer is a layer comprised of titanium carbonitride. However, such titanium carbonitride layer may contain a very small amount of components other than titanium carbonitride, as long as it comprises the above-described configuration and provides the operation and effects obtained through the titanium carbonitride layer.

The coating layer of the present embodiment preferably satisfies the condition represented by formula (A) below:

0≤|S1−S2|≤400 . . . (A). In formula (A), S1 refers to a residual stress value (unit: MPa) in the (4,0,10) plane of the α-type aluminum oxide layer, and S2 denotes to a residual stress value (unit: MPa) in the (4,2,2) plane of the titanium carbonitride layer. If the absolute value of a difference between S1 and S2 [|S1−S2|] is 400 MPa or lower, this indicates the tendency of the fracture resistance of the coated cutting tool to be further improved. From the same perspective, the absolute value of the difference |S1|S2| is more preferably from 0 MPa or higher to 350 MPa or lower, and is further preferably from 0 MPa or higher to 300 MPa or lower.

If the absolute value of the difference |S1−S2| is 400 MPa or lower, the factors for further improvement in the fracture resistance of the coated cutting tool can be considered to be set forth as follows. However, the present invention is not limited, in any way, by the factors set forth below. As described above, the residual stress value in the (4,0,10) plane of the α-type aluminum oxide layer can be considered to relatively refer to the inner-side residual stress of the α-type aluminum oxide layer. Therefore, a small difference between the inner-side residual stress value of the α-type aluminum oxide layer which is closer to the titanium carbonitride layer and the residual stress value of the titanium carbonitride layer leads to the tendency of the adhesion between the α-type aluminum oxide layer and the titanium carbonitride layer to be improved. This can further prevent cracking in the coating layer from reaching toward the substrate, thereby resulting in the tendency of the fracture resistance of the coated cutting tool to be further improved.

(Intermediate Layer)

The coating layer of the present embodiment preferably includes, between the titanium carbonitride layer and the α-type aluminum oxide layer, an intermediate layer comprising a compound of at least one kind selected from the group consisting of a Ti carboxide, a Ti oxynitride and a Ti carboxynitride from the perspective of further improvement of adhesion.

The average thickness of such intermediate layer is preferably from 0.1 μm or more to 1.5 μm or less. This is preferable in that: if the average thickness of the intermediate layer is 0.1 μm or more, this indicates the tendency of the adhesion to be further improved; and, if such average thickness is 1.5 μm or less, this indicates the tendency of the texture coefficient TC (0,0,12) of the (0,0,12) plane in the α-type aluminum oxide layer to have a greater value. From the same perspective, the average thickness of the intermediate layer is more preferably from 0.2 μm or more to 1.0 μm or less, and is further preferably from 0.4 μm or more to 0.6 μm or less.

The intermediate layer is a layer comprising a compound of at least one kind selected from the group consisting of a Ti carboxide, a Ti oxynitride and a Ti carboxynitride. However, such intermediate layer may contain a very small amount of components other than the above compound, as long as it comprises the above-described configuration and provides the operation and effects of the intermediate layer.

The coating layer of the present embodiment preferably comprises a TiN layer as an outermost layer on the α-type aluminum oxide layer as this makes it possible to confirm the usage state, such as whether or not the coated cutting tool has been used, thereby leading to excellent visibility. The average thickness of the TiN layer is preferably from 0.2 μm or more to 1.0 μm or less. This is preferable in that: if the average thickness of the TiN layer is 0.2 μm or more, this provides the effect of further suppressing the falling of particles from the α-type aluminum oxide layer; and, if such average thickness is 1.0 μm or less, the fracture resistance of the coated cutting tool is improved. From the same perspective, the average thickness of the TiN layer is more preferably from 0.3 μm or more to 0.9 μm or less.

The coating layer of the present embodiment preferably comprises, between the substrate and the titanium carbonitride layer, a TiN layer serving as a lowermost layer in the coating layer, as this leads to adhesion being further improved. The average thickness of this TiN layer is preferably from 0.1 μm or more to 0.5 μm or less. If the average thickness of the TiN layer is 0.1 μm or more, this indicates the tendency of the adhesion to be further improved as the TiN layer has a more uniform structure. Meanwhile, if the average thickness of the TiN layer is 0.5 μm or less, this indicates the tendency of the fracture resistance to be further enhanced as the TiN layer, being the lowermost layer, is further prevented from serving as a starting point of peeling.

The TiN layers respectively, serving as the outermost layer and the lowermost layer, are each a layer comprised of TiN. However, such TiN layers may each contain a very small amount of components other than TiN, as long as they respectively comprise the above-described configurations and provide the operation and effects of the outermost layer and the lowermost layer.

Examples of a method of forming layers that constitute a coating layer in a coated cutting tool according to the present invention include the method set forth below. However, such method of forming layers is not limited thereto.

For instance, a TiN layer, serving as the outermost layer, can be formed by chemical vapor deposition with a raw material composition of $TiCl_4$: from 5.0 mol % or more to 10.0 mol % or less, $N_2$: from 20 mol % or more to 60 mol % or less, and $H_2$: the balance, a temperature of from 850° C. or higher to 920° C. or lower, and a pressure of from 100 hPa or higher to 400 hPa or lower.

For instance, a TiC layer, serving as the lowermost layer, can be formed by chemical vapor deposition with a raw material composition of $TiCl_4$: from 2.0 mol % or more to 3.0 mol % or less, $CH_4$: from 4.0 mol % or more to 6.0 mol % or less, and $H_2$: the balance, a temperature of from 980° C. or higher to 1020° C. or lower, and a pressure of from 60 hPa or higher to 80 hPa or lower.

A TiCN layer, being a layer comprised of a titanium carbonitride, can be formed by chemical vapor deposition with a raw material composition of $TiCl_4$: from 8.0 mol % or more to 18.0 mol % or less, $CH_3CN$: from 1.0 mol % or more to 3.0 mol % or less, and $H_2$: the balance, a temperature of from 840° C. or higher to 890° C. or lower, and a pressure of from 60 hPa or higher to 80 hPa or lower.

For instance, as the intermediate layer, a TiCNO layer, being a layer comprised of a Ti carboxynitride, can be formed by chemical vapor deposition with a raw material composition of $TiCl_4$: from 3.0 mol % or more to 5.0 mol % or less, CO: from 0.4 mol % or more to 1.0 mol % or less, $N_2$: from 30 mol % or more to 40 mol % or less, and $H_2$: the balance, a temperature of from 975° C. or higher to 1,025° C. or lower, and a pressure of from 90 hPa or higher to 110 hPa or lower.

For instance, as the intermediate layer, a TiCO layer, being a layer comprised of a Ti carboxide, can be formed by chemical vapor deposition with a raw material composition of $TiCl_4$: from 0.5 mol % or more to 1.5 mol % or less, CO: from 2.0 mol % or more to 4.0 mol % or less, and $H_2$: the balance, a temperature of from 975° C. or higher to 1,025° C. or lower, and a pressure of from 60 hPa or higher to 100 hPa or lower.

For instance, a TiN layer, serving as the outermost layer, can be formed by chemical vapor deposition with a raw material composition of $TiCl_4$: from 5.0 mol % or more to 10.0 mol % or less, $N_2$: from 20 mol % or more to 60 mol % or less, and $H_2$: the balance, a temperature of from 980° C. or higher to 1,020° C. or lower, and a pressure of from 100 hPa or higher to 400 hPa or lower.

In the present embodiment, a coated cutting tool which involves the controlled orientation (orientation relationship) of an α-type aluminum oxide layer can be obtained by, for example, the method set forth below.

Firstly, one or more layers selected from the group consisting of a titanium carbonitride layer, if necessary, a TiN layer, also if necessary, and the intermediate layer is(are) formed on a surface of a substrate. Next, from among the above layers, a surface of a layer which is most distant from the substrate is oxidized. Thereafter, a nucleus of an α-type aluminum oxide layer is formed on the surface of the layer which is most distant from the substrate, and an α-type aluminum oxide layer is then formed in the state in which such nucleus has been formed. Further, as needed, a TiN layer may be formed on a surface of the α-type aluminum oxide layer.

The nucleus of the α-type aluminum oxide layer may be formed with a very small amount of CO gas being caused to flow at a low temperature. This leads to the formation of the nucleus of the α-type aluminum oxide layer at a very slow rate and also leads to the tendency of the nucleus of the α-type aluminum oxide layer to be minute. The time for the formation of the nucleus of the α-type aluminum oxide layer is preferably from 2 minutes or more to 5 minutes or less. Thus, the α-type aluminum oxide layer is prone to have preferential orientation of a (0,0,12) plane.

It is preferable that, after the formation of the nucleus of the α-type aluminum oxide layer, the α-type aluminum oxide layer is formed under the condition that a CO gas is not caused to flow. At this time, the deposition temperature is preferably made higher than the temperature at which the nucleus of the α-type aluminum oxide layer is formed.

More specifically, the oxidation of the surface of the layer which is most distant from the substrate is performed under the conditions of a raw material composition of $CO_2$: from 0.1 mol % or more to 1.0 mol % or less and $H_2$: the balance, a temperature of from 950° C. or higher to 1,000° C. or lower, and a pressure of from 50 hPa or higher to 70 hPa or lower. Here, the oxidation time is preferably from 5 minutes or more to 10 minutes or less.

Thereafter, the nucleus of the α-type aluminum oxide layer is formed by chemical vapor deposition with a raw material composition of $AlCl_3$: from 1.0 mol % or more to 4.0 mol % or less, $CO_2$: from 1.0 mol % or more to 3.0 mol % or less, CO: from 0.1 mol % or more to 2.0 mol % or less, HCl: from 2.0 mol % or more to 3.0 mol % or less, and $H_2$: the balance, a temperature of from 880° C. or higher to 930° C. or lower, and a pressure of from 60 hPa or higher to 80 hPa or lower.

The α-type aluminum oxide layer is then formed by chemical vapor deposition with a raw material composition of $AlCl_3$: from 2.0 mol % or more to 5.0 mol % or less, $CO_2$: from 2.5 mol % or more to 4.0 mol % or less, HCl: from 2.0 mol % or more to 3.0 mol % or less, $H_2S$: from 0.15 mol % or more to 0.25 mol % or less, and $H_2$: the balance, a temperature of from 970° C. or higher to 1,030° C. or lower, and a pressure of from 60 hPa or higher to 80 hPa or lower.

In the present embodiment, a coated cutting tool which involves the controlled residual stress value of a coating layer can be obtained by, for example, the method set forth below.

After the formation of the coating layer, dry blasting is performed thereon with two conditions, whereby the residual stress value of the coating layer can be controlled. As to the first condition for dry blasting, a shot material may be shot onto a surface of the coating layer at a shot pressure of from 0.2 bar or higher to 0.5 bar or lower and for a shot time of from 0.5 minutes or more to 3 minutes or less so as to achieve a shot angle of from 30° or more to 55° or less. The shot material for dry blasting is preferably a material, such as $Al_2O_3$ or $ZrO_2$, with an average particle size of from 100 μm or more to 200 μm or less. As to the second condition for dry blasting, a shot material may be shot onto a surface of the coating layer at a shot pressure of from 1.0 bar or higher to 1.5 bar or lower and for a shot time of from 0.5 minutes or more to 1 minute or less so as to achieve a shot angle of from 10° or more to 20° or less. The shot material for dry blasting is preferably silicon carbide (SiC) with an average particle size of from 100 μm or more to 150 μm or less.

The thickness of each layer in the coating layer of the coated cutting tool of the present embodiment can be measured by observing a cross-sectional structure of the coated cutting tool, using an optical microscope, a scanning electron microscope (SEM), an FE-SEM, or the like. It should be noted that, as to the average thickness of each layer in the coated cutting tool of the present embodiment, such average thickness can be obtained by: measuring the thickness of each layer at three or more locations near the position 50 μm from the edge, toward the center of the rake surface of the coated cutting tool; and calculating the arithmetic mean of the resulting measurements. Further, the composition of each layer can be measured from a cross-sectional structure of the coated cutting tool of the present embodiment, using an energy-dispersive X-ray spectroscope (EDS), a wavelength-dispersive X-ray spectroscope (WDS), or the like.

EXAMPLES

Although the present invention will be described in further detail below, with examples, the present invention is not limited to such examples.

A cemented carbide cutting insert with a shape of JIS certified VNMG160408 and a composition of 92.0WC-7.5Co-0.5$Cr_3C_2$ (mass %) was prepared as a substrate. The edge of such substrate was subjected to round honing by means of an SiC brush, and a surface of the substrate was then washed.

After the substrate surface was washed, a coating layer was formed by chemical vapor deposition. As to invention samples 1 to 11, firstly, the substrate was inserted into an external heating chemical vapor deposition apparatus, and a lowermost layer, whose composition is shown in Table 1, was formed on the substrate surface so as to have the average thickness shown in Table 1 under the raw material composition, temperature and pressure conditions shown in Table 2. Then, a titanium carbonitride layer (hereinafter referred to as a "TiCN layer"), whose composition is shown in Table 1, was formed on the surface of the lowermost layer so as to have the average thickness shown in Table 1 under the raw material composition, temperature and pressure conditions shown in Table 2. Next, an intermediate layer, whose composition is shown in Table 1, was formed on the surface of the TiCN layer so as to have the average thickness shown in Table 1 under the raw material composition, temperature and pressure conditions shown in Table 2. Thereafter, a surface of the intermediate layer was oxidized under the raw material composition, temperature and pressure conditions shown in Table 3. At this time, the oxidation process time was set at 7 minutes. Then, a nucleus of α-type aluminum oxide was formed on the oxidized surface of the intermediate layer under the raw material composition, temperature and pressure conditions concerning the "nucleus formation conditions for an α-type aluminum oxide layer" shown in Table 4. At this time, the time for the formation of the nucleus of an α-type aluminum oxide layer was set at 4 minutes. Further, an α-type aluminum oxide layer, whose composition is shown in Table 1, was formed on the surface of the intermediate layer and the surface of the nucleus of α-type aluminum oxide so as to have the average thickness shown in Table 1 under the raw material composition, temperature and pressure conditions concerning the "deposition conditions" shown in Table 4. Lastly, an outermost layer, whose composition is shown in Table 1, was formed on the surface of the α-type aluminum oxide layer so as to have the average thickness shown in Table 1 under the raw material composition, temperature and pressure conditions shown in Table 2. As a result, the coated cutting tools of invention samples 1 to 11 were obtained.

Meanwhile, as to comparative samples 1 to 7, firstly, the substrate was inserted into an external heating chemical vapor deposition apparatus, and a lowermost layer, whose composition is shown in Table 1, was formed on the substrate surface so as to have the average thickness shown in Table 1 under the raw material composition, temperature and pressure conditions shown in Table 2. Then, a TiCN layer, whose composition is shown in Table 1, was formed on the surface of the lowermost layer so as to have the average thickness shown in Table 1 under the raw material composition, temperature and pressure conditions shown in Table 2. Next, an intermediate layer, whose composition is shown in Table 1, was formed on the surface of the TiCN layer so as to have the average thickness shown in Table 1 under the raw material composition, temperature and pressure conditions shown in Table 2. Thereafter, the surface of the intermediate layer was oxidized under the raw material composition, temperature and pressure conditions shown in Table 3. At this time, the oxidation process time was set at 7 minutes. Then, a nucleus of an α-type aluminum oxide layer was formed on the oxidized surface of the intermediate layer under the raw material composition, temperature and pressure conditions concerning the "nucleus formation conditions" shown in Table 5. At this time, the time for the formation of the nucleus of an α-type aluminum oxide layer was set at 4 minutes. Further, an α-type aluminum oxide layer, whose composition is shown in Table 1, was formed on the surface of the intermediate layer and the surface of the nucleus of α-type aluminum oxide so as to have the average thickness shown in Table 1 under the raw material composition, temperature and pressure conditions concerning the "deposition conditions" shown in Table 5. Lastly, an outermost layer, whose composition is shown in Table 1, was formed on the surface of the α-type aluminum oxide layer so as to have the average thickness shown in Table 1 under the raw material composition, temperature and pressure conditions shown in Table 2. As a result, the coated cutting tools of comparative samples 1 to 7 were obtained.

The thickness of each layer of each of the samples was obtained as set forth below. That is, using an FE-SEM, the average thickness was obtained by: measuring the thickness of each layer, from each of the cross-sectional surfaces at three locations near the position 50 μm from the edge of the coated cutting tool, toward the center of the rake surface thereof; and calculating the arithmetic mean of the resulting measurements. Using an EDS, the composition of each layer of the obtained sample was measured from the cross-sectional surface near the position at most 50 μm from the edge of the coated cutting tool, toward the center of the rake surface thereof.

TABLE 1

| | Coating layer | | | | | | | | | |
|---|---|---|---|---|---|---|---|---|---|---|
| | Lowermost layer | | TiCN layer | | Intermediate layer | | α-type Al₂O₃ layer | | Outermost layer | |
| Sample No. | Composition | Average thickness (μm) | Composition | Average thickness (μm) | Composition | Average thickness (μm) | Crystal system | Average thickness (μm) | Composition | Average thickness (μm) | Total thickness (μm) |
| Invention sample 1 | TiN | 0.1 | TiCN | 7.4 | TiCNO | 0.2 | α | 8.1 | TiN | 0.4 | 16.2 |
| Invention sample 2 | TiN | 0.2 | TiCN | 10.9 | TiCNO | 0.2 | α | 4.9 | TiN | 0.5 | 16.7 |
| Invention sample 3 | TiN | 0.1 | TiCN | 7.8 | TiCNO | 0.1 | α | 9.5 | TiN | 0.3 | 17.8 |
| Invention sample 4 | TiN | 0.1 | TiCN | 8 | TiCO | 0.1 | α | 9.2 | TiN | 0.5 | 17.9 |
| Invention sample 5 | TiN | 0.5 | TiCN | 18.2 | TiCNO | 0.4 | α | 4.2 | TiN | 0.2 | 23.5 |
| Invention sample 6 | TiN | 0.2 | TiCN | 8.2 | TiCNO | 0.2 | α | 10.1 | TiN | 0.3 | 19 |
| Invention sample 7 | TiN | 0.3 | TiCN | 4.4 | TiCNO | 0.5 | α | 8.9 | TiN | 0.2 | 14.3 |
| Invention sample 8 | TiC | 0.3 | TiCN | 8.2 | TiCNO | 0.4 | α | 3.1 | TiN | 0.2 | 12.2 |
| Invention sample 9 | TiN | 0.1 | TiCN | 3.2 | TiCNO | 0.1 | α | 15.3 | TiN | 0.6 | 19.3 |
| Invention sample 10 | TiN | 0.7 | TiCN | 5.3 | TiCO | 0.4 | α | 5.2 | TiN | 0.9 | 12.5 |
| Invention sample 11 | TiN | 0.1 | TiCN | 4.6 | TiCNO | 0.6 | α | 8.5 | TiN | 0.2 | 14 |
| Comparative sample 1 | TiN | 0.2 | TiCN | 9.1 | TiCO | 0.1 | α | 7.4 | TiN | 0.2 | 17 |
| Comparative sample 2 | TiN | 0.4 | TiCN | 3.2 | TiCO | 0.6 | α | 3.3 | TiN | 0.5 | 8 |
| Comparative sample 3 | TiN | 0.5 | TiCN | 5.9 | TiCNO | 0.6 | α | 5.7 | TiN | 0.2 | 12.9 |
| Comparative sample 4 | TiN | 0.2 | TiCN | 10.7 | TiCNO | 0.2 | α | 7.2 | TiN | 0.2 | 18.5 |
| Comparative sample 5 | TiN | 0.3 | TiCN | 11.2 | TiCNO | 0.5 | α | 10.3 | TiN | 1.2 | 23.5 |
| Comparative sample 6 | TiN | 0.4 | TiCN | 11.8 | TiCNO | 0.5 | α | 2.3 | TiN | 0.4 | 15.4 |
| Comparative sample 7 | TiN | 0.1 | TiCN | 5.4 | TiCNO | 0.1 | α | 9.9 | TiN | 0.2 | 15.7 |

TABLE 2

| Each layer composition | Temperature (° C.) | Pressure (hPa) | Raw material composition (mol %) |
|---|---|---|---|
| TiN (lowermost layer) | 900 | 350 | TiCl₄: 7.5%, N₂: 40.0%, H₂: 52.5% |
| TiC | 1,000 | 75 | TiCl₄: 2.4%, CH₄: 4.6%, H₂: 93.0% |
| TiCN | 840 | 70 | TiCl₄: 12.0%, CH₃CN: 2.0%, H₂: 86.0% |
| TiCNO | 1,000 | 100 | TiCl₄: 3.5%, CO: 0.7%, N₂: 35.5%, H₂: 60.3% |
| TiCO | 1,000 | 80 | TiCl₄: 1.3%, CO: 2.7%, H₂: 96.0% |
| TiN (outermost layer) | 1,000 | 350 | TiCl₄: 7.5%, N₂: 40.0%, H₂: 52.5% |

TABLE 3

| | Temperature (° C.) | Pressure (hPa) | Raw material composition (mol %) |
|---|---|---|---|
| Oxidation process | 960 | 70 | $CO_2$: 0.5%, $H_2$: 99.5% |

As to invention samples 1 to 11 and comparative samples 1 to 7, after the formation of the coating layer on the surface of the substrate, dry shot blasting was performed on a surface of the coating layer under the shot conditions shown in Table 6, using the shot material shown in Table 6. It should be noted that the term "no process" in the table refers to no performance of dry blasting.

TABLE 4

| | Nucleus formation conditions for an α-type aluminum oxide layer | | | Deposition conditions | | |
|---|---|---|---|---|---|---|
| Sample No. | Temperature (° C.) | Pressure (hPa) | Raw material composition (mol %) | Temperature (° C.) | Pressure (hPa) | Raw material composition (mol %) |
| Invention sample 1 | 900 | 70 | $AlCl_3$: 2.0%, $CO_2$: 3.0%, CO: 1.5%, HCl: 3.0%, $H_2$: 90.5% | 1,010 | 70 | $AlCl_3$: 3.0%, $CO_2$: 3.0%, HCl: 3.0%, $H_2S$: 0.2%, $H_2$: 90.8% |
| Invention sample 2 | 880 | 70 | $AlCl_3$: 3.0%, $CO_2$: 1.5%, CO: 1.5%, HCl: 2.0%, $H_2$: 92.0% | 970 | 70 | $AlCl_3$: 2.0%, $CO_2$: 2.5%, HCl: 2.5%, $H_2S$: 0.2%, $H_2$: 92.8% |
| Invention sample 3 | 900 | 70 | $AlCl_3$: 2.5%, $CO_2$: 1.0%, CO: 1.5%, HCl: 2.5%, $H_2$: 92.5% | 990 | 70 | $AlCl_3$: 4.0%, $CO_2$: 4.0%, HCl: 2.5%, $H_2S$: 0.2%, $H_2$: 89.3% |
| Invention sample 4 | 900 | 70 | $AlCl_3$: 4.0%, $CO_2$: 1.5%, CO: 2.0%, HCl: 2.5%, $H_2$: 90.0% | 1,010 | 70 | $AlCl_3$: 5.0%, $CO_2$: 3.0%, HCl: 2.3%, $H_2S$: 0.15%, $H_2$: 89.55% |
| Invention sample 5 | 880 | 60 | $AlCl_3$: 1.0%, $CO_2$: 3.0%, CO: 1.0%, HCl: 2.0%, $H_2$: 93.0% | 970 | 60 | $AlCl_3$: 3.5%, $CO_2$: 3.5%, HCl: 2.3%, $H_2S$: 0.2%, $H_2$: 90.5% |
| Invention sample 6 | 930 | 70 | $AlCl_3$: 2.0%, $CO_2$: 2.0%, CO: 1.5%, HCl: 2.2%, $H_2$: 92.3% | 1,010 | 70 | $AlCl_3$: 2.5%, $CO_2$: 3.0%, HCl: 2.0%, $H_2S$: 0.25%, $H_2$: 92.25% |
| Invention sample 7 | 900 | 80 | $AlCl_3$: 3.0%, $CO_2$: 1.5%, CO: 0.1%, HCl: 2.5%, $H_2$: 92.9% | 990 | 80 | $AlCl_3$: 4.5%, $CO_2$: 3.0%, HCl: 2.5%, $H_2S$: 0.2%, $H_2$: 89.8% |
| Invention sample 8 | 880 | 60 | $AlCl_3$: 1.5%, $CO_2$: 2.5%, CO: 0.1%, HCl: 2.0%, $H_2$: 93.9% | 990 | 60 | $AlCl_3$: 3.0%, $CO_2$: 3.0%, HCl: 3.0%, $H_2S$: 0.2%, $H_2$: 90.8% |
| Invention sample 9 | 930 | 60 | $AlCl_3$: 3.0%, $CO_2$: 3.0%, CO: 2.0%, HCl: 2.3%, $H_2$: 89.7% | 1,010 | 60 | $AlCl_3$: 3.5%, $CO_2$: 3.5%, HCl: 2.3%, $H_2S$: 0.2%, $H_2$: 90.5% |
| Invention sample 10 | 900 | 70 | $AlCl_3$: 2.0%, $CO_2$: 2.5%, CO: 0.1%, HCl: 2.5%, $H_2$: 92.9% | 1,030 | 70 | $AlCl_3$: 4.0%, $CO_2$: 4.0%, HCl: 2.5%, $H_2S$: 0.2%, $H_2$: 89.3% |
| Invention sample 11 | 900 | 80 | $AlCl_3$: 1.5%, $CO_2$: 2.3%, CO: 1.5%, HCl: 2.3%, $H_2$: 92.4% | 990 | 80 | $AlCl_3$: 5.0%, $CO_2$: 3.0%, HCl: 2.3%, $H_2S$: 0.15%, $H_2$: 89.55% |

TABLE 5

| | Nucleus formation conditions | | | Deposition conditions | | |
|---|---|---|---|---|---|---|
| Sample No. | Temperature (° C.) | Pressure (hPa) | Raw material composition (mol %) | Temperature (° C.) | Pressure (hPa) | Raw material composition (mol %) |
| Comparative sample 1 | 900 | 60 | $AlCl_3$: 2.0%, $CO_2$: 1.5%, CO: 0.05%, HCl: 2.5%, $H_2$: 93.95% | 990 | 60 | $AlCl_3$: 2.0%, $CO_2$: 2.5%, HCl: 2.5%, $H_2S$: 0.2%, $H_2$: 92.8% |
| Comparative sample 2 | 880 | 80 | $AlCl_3$: 4.0%, $CO_2$: 1.0%, HCl: 2.0%, $H_2$: 93.0% | 970 | 80 | $AlCl_3$: 3.0%, $CO_2$: 3.0%, HCl: 3.0%, $H_2S$: 0.2%, $H_2$: 90.8% |
| Comparative sample 3 | 900 | 70 | $AlCl_3$: 3.0%, $CO_2$: 1.5%, CO: 0.1%, HCl: 2.5%, $H_2$: 92.9% | 990 | 70 | $AlCl_3$: 3.5%, $CO_2$: 3.5%, HCl: 2.3%, $H_2S$: 0.2%, $H_2$: 90.5% |
| Comparative sample 4 | 900 | 70 | $AlCl_3$: 2.0%, $CO_2$: 2.5%, CO: 0.1%, HCl: 2.5%, $H_2$: 92.9% | 990 | 70 | $AlCl_3$: 4.0%, $CO_2$: 3.0%, HCl: 2.3%, $H_2S$: 0.15%, $H_2$: 90.55% |
| Comparative sample 5 | 930 | 70 | $AlCl_3$: 2.0%, $CO_2$: 1.5%, CO: 0.05%, HCl: 2.5%, $H_2$: 93.95% | 1,010 | 70 | $AlCl_3$: 3.0%, $CO_2$: 3.0%, HCl: 3.0%, $H_2S$: 0.2%, $H_2$: 90.8% |
| Comparative sample 6 | 880 | 60 | $AlCl_3$: 2.0%, $CO_2$: 3.0%, HCl: 2.5%, $H_2$: 92.5% | 970 | 60 | $AlCl_3$: 2.0%, $CO_2$: 2.5%, HCl: 2.5%, $H_2S$: 0.2%, $H_2$: 92.8% |
| Comparative sample 7 | 930 | 70 | $AlCl_3$: 3.0%, $CO_2$: 3.0%, HCl: 3.0%, $H_2$: 91.0% | 1,010 | 70 | $AlCl_3$: 4.0%, $CO_2$: 4.0%, HCl: 2.5%, $H_2S$: 0.2%, $H_2$: 89.3% |

TABLE 6

| Sample No. | Condition (1) Shot material Material | Condition (1) Shot material Average particle size (μm) | Condition (1) Shot conditions Shot angle (°) | Condition (1) Shot conditions Shot pressure (bar) | Condition (1) Shot conditions Shot time (min) | Condition (2) Shot material Material | Condition (2) Shot material Average particle size (μm) | Condition (2) Shot conditions Shot angle (°) | Condition (2) Shot conditions Shot pressure (bar) | Condition (2) Shot conditions Shot time (min) |
|---|---|---|---|---|---|---|---|---|---|---|
| Invention sample 1 | ZrO$_2$ | 150 | 45 | 0.5 | 2.5 | SiC | 150 | 20 | 1.3 | 1 |
| Invention sample 2 | Al$_2$O$_3$ | 150 | 45 | 0.3 | 1.5 | SiC | 100 | 20 | 1.3 | 0.5 |
| Invention sample 3 | Al$_2$O$_3$ | 200 | 55 | 0.5 | 2.5 | SiC | 130 | 20 | 1.3 | 1 |
| Invention sample 4 | Al$_2$O$_3$ | 150 | 55 | 0.5 | 1.5 | SiC | 130 | 20 | 1.3 | 1 |
| Invention sample 5 | Al$_2$O$_3$ | 120 | 30 | 0.3 | 0.5 | SiC | 150 | 20 | 1.5 | 1 |
| Invention sample 6 | Al$_2$O$_3$ | 200 | 55 | 0.5 | 2.5 | SiC | 130 | 20 | 1.3 | 1 |
| Invention sample 7 | Al$_2$O$_3$ | 120 | 30 | 0.3 | 0.5 | SiC | 130 | 10 | 1 | 1 |
| Invention sample 8 | ZrO$_2$ | 200 | 55 | 0.5 | 2.5 | SiC | 150 | 20 | 1.5 | 1 |
| Invention sample 9 | ZrO$_2$ | 150 | 45 | 0.5 | 3 | SiC | 150 | 20 | 1.5 | 1 |
| Invention sample 10 | Al$_2$O$_3$ | 100 | 30 | 0.3 | 0.5 | SiC | 130 | 10 | 1 | 1 |
| Invention sample 11 | Al$_2$O$_3$ | 150 | 45 | 0.5 | 1.5 | SiC | 100 | 10 | 1.3 | 0.5 |
| Comparative sample 1 | Al$_2$O$_3$ | 100 | 30 | 0.3 | 0.5 | No process | | | | |
| Comparative sample 2 | Al$_2$O$_3$ | 150 | 45 | 0.3 | 1.5 | SiC | 100 | 20 | 1.3 | 0.5 |
| Comparative sample 3 | No process | | | | | No process | | | | |
| Comparative sample 4 | ZrO$_2$ | 250 | 75 | 1 | 5 | No process | | | | |
| Comparative sample 5 | SiC | 100 | 10 | 0.8 | 1 | No process | | | | |
| Comparative sample 6 | SiC | 130 | 10 | 1.3 | 1 | No process | | | | |
| Comparative sample 7 | Al$_2$O$_3$ | 150 | 45 | 0.5 | 1.5 | SiC | 100 | 10 | 1.3 | 0.5 |

As to the obtained invention samples, i.e., invention samples 1 to 11 and comparative samples 1 to 7, an X-ray diffraction measurement by means of a 2θ/θ focusing optical system with Cu-Kα radiation was performed under the following conditions: an output: 50 kV, 250 mA; an incident-side solar slit: 5°; a divergence longitudinal slit: ⅔°; a divergence longitudinal limit slit: 5 mm; a scattering slit: ⅔°; a light-receiving side solar slit: 5°; a light-receiving slit: 0.3 mm; a BENT monochromator; a light-receiving monochrome slit: 0.8 mm; a sampling width: 0.01°; a scan speed: 4°/min; and a 2θ measurement range: 20°-155°. As to the apparatus, an X-ray diffractometer (model "RINT TTR III") manufactured by Rigaku Corporation was used. The peak intensity for each crystal plane of the α-type aluminum oxide layer was obtained from an X-ray diffraction pattern. A texture coefficient TC (0,0,12) in the α-type aluminum oxide layer was obtained from the resulting peak intensity for each crystal plane. The results are shown in Table 7.

TABLE 7

| Sample No. | α-type Al$_2$O$_3$ layer TC (0, 0, 12) |
|---|---|
| Invention sample 1 | 7.2 |
| Invention sample 2 | 7.5 |
| Invention sample 3 | 6.9 |
| Invention sample 4 | 7.8 |
| Invention sample 5 | 5.2 |
| Invention sample 6 | 7.3 |
| Invention sample 7 | 4.3 |
| Invention sample 8 | 4.1 |
| Invention sample 9 | 7.8 |
| Invention sample 10 | 4.1 |
| Invention sample 11 | 6.9 |
| Comparative sample 1 | 2.3 |
| Comparative sample 2 | 0.9 |
| Comparative sample 3 | 4.2 |
| Comparative sample 4 | 4.3 |
| Comparative sample 5 | 2.5 |
| Comparative sample 6 | 0.9 |
| Comparative sample 7 | 0.5 |

The residual stress value of the α-type aluminum oxide layer and the residual stress value of the titanium carbonitride layer in each of the obtained samples were obtained by performing measurements on an arbitrary portion of a rake surface by a sin$^2$φ method using an X-ray stress measuring apparatus (model "RINT TTR III" manufactured by Rigaku Corporation). Further, an absolute value of a difference between residual stress values |S1−S2| was obtained from the measurement results. The measurement results are shown in Table 8.

TABLE 8

| Sample No. | α-type Al$_2$O$_3$ layer Residual stress value with regard to a (1, 1, 6) plane (MPa) | α-type Al$_2$O$_3$ layer Residual stress value with regard to a (4, 0, 10) plane (MPa) | TiCN layer Residual stress value with regard to a (4, 2, 2) plane (MPa) | Absolute value of difference between residual stress values \| S1 − S2 \| |
|---|---|---|---|---|
| Invention sample 1 | −397 | 50 | 158 | 108 |
| Invention sample 2 | 32 | 59 | 262 | 203 |
| Invention sample 3 | −173 | 54 | 171 | 117 |
| Invention sample 4 | −216 | 78 | 190 | 112 |
| Invention sample 5 | −569 | 13 | 303 | 290 |
| Invention sample 6 | −165 | 48 | 163 | 115 |
| Invention sample 7 | −232 | 172 | 326 | 154 |
| Invention sample 8 | −478 | 21 | 83 | 62 |
| Invention sample 9 | −484 | 22 | 151 | 129 |
| Invention sample 10 | −229 | 274 | 410 | 136 |
| Invention sample 11 | 78 | 113 | 255 | 142 |
| Comparative sample 1 | 223 | 348 | 416 | 68 |
| Comparative sample 2 | 26 | 68 | 355 | 287 |
| Comparative sample 3 | 348 | 454 | 498 | 44 |
| Comparative sample 4 | −728 | −125 | 21 | 146 |
| Comparative sample 5 | 165 | 144 | 487 | 343 |
| Comparative sample 6 | −65 | 11 | 423 | 412 |
| Comparative sample 7 | 54 | 115 | 367 | 252 |

Cutting tests 1 and 2 were conducted using the obtained invention samples, i.e., invention samples 1 to 11 and comparative samples 1 to 7, under the following conditions. Cutting test 1 is a wear test for evaluating wear resistance, and cutting test 2 is a fracture test for evaluating fracture resistance. The results of the respective cutting tests are shown in Table 9.

[Cutting Test 1]
Workpiece material: S45C round bar
Cutting speed: 310 m/min
Feed: 0.25 mm/rev
Depth of cut: 2.0 mm
Coolant: used
Evaluation items: A time when a sample was fractured or had a maximum flank wear width of 0.2 mm was defined as the end of the tool life, and the machining time to reach the end of the tool life was measured.

[Cutting Test 2]
Workpiece material: SCM415 round bar with two equidistant grooves extending in the length direction
Cutting speed: 150 m/min
Feed: 0.35 mm/rev
Depth of cut: 1.5 mm
Coolant: used
Evaluation items: A time when a sample was fractured was defined as the end of the tool life, and the number of shocks the sample had received until the end of the tool life was measured. The number of times the sample and the workpiece material were brought into contact with each other was defined as the number of shocks, and the test was ended when the sample was fractured. It should be noted that, as to each sample, five inserts were prepared and the number of shocks was measured for each of such cutting inserts, and the arithmetic mean was obtained from the measurements of the number of shocks so as to serve as the tool life.

As to the machining time to reach the end of the tool life in cutting test 1 (wear test), evaluations were made with grade "A" for 15 minutes or more, grade "B" for 10 minutes or more and less than 15 minutes, and grade "C" for less than 10 minutes. Further, as to the number of shocks until the end of the tool life in cutting test 2 (fracture test), evaluations were made with grade "A" for 10,000 or more, grade "B" for 5,000 or more and less than 10,000, and grade "C" for less than 5,000. In such evaluations, "A" refers to excellent, "B" refers to good and "C" refers to inferior, meaning that a sample involving a larger number of "A"s or "B"s has more excellent cutting performance. The evaluation results are shown in Table 9.

TABLE 9

| Sample No. | Cutting test 1 Tool life (min) | Cutting test 1 Grade | Cutting test 1 Damage form | Cutting test 2 Tool life (shocks) | Cutting test 2 Grade |
|---|---|---|---|---|---|
| Invention sample 1 | 16 | A | Normal wear | 11,700 | A |
| Invention sample 2 | 15 | A | Normal wear | 7,600 | B |
| Invention sample 3 | 18 | A | Normal wear | 8,500 | B |
| Invention sample 4 | 18 | A | Normal wear | 10,700 | A |
| Invention sample 5 | 26 | A | Normal wear | 8,000 | B |
| Invention sample 6 | 24 | A | Normal wear | 12,100 | A |
| Invention sample 7 | 12 | B | Normal wear | 11,300 | A |
| Invention sample 8 | 13 | B | Normal wear | 13,200 | A |
| Invention sample 9 | 16 | A | Normal wear | 9,700 | B |
| Invention sample 10 | 12 | B | Normal wear | 7,000 | B |
| Invention sample 11 | 17 | A | Normal wear | 9,800 | B |
| Comparative sample 1 | 3 | C | Fracturing | 1,501 | C |
| Comparative sample 2 | 2 | C | Fracturing | 1,500 | C |
| Comparative sample 3 | 3 | C | Fracturing | 800 | C |
| Comparative sample 4 | 7 | C | Normal wear | 4,200 | C |
| Comparative sample 5 | 6 | C | Normal wear | 6,500 | B |
| Comparative sample 6 | 11 | B | Fracturing | 1,500 | C |
| Comparative sample 7 | 9 | C | Normal wear | 1,600 | C |

The results of Table 9 show that each invention sample had grade "B" or higher in both the wear test and the fracture test. Meanwhile, as to the evaluations on the comparative samples, each comparative sample had grade "C" in either or both of the wear test and the fracture test. Accordingly, it is apparent that the wear resistance and fracture resistance of each invention sample is more excellent than that of each comparative sample.

It is apparent from the above results that each invention sample has excellent wear resistance and fracture resistance, thereby resulting in a longer tool life.

The present application is based on the Japanese application filed on Feb. 20, 2017 (JP Appl. 2017-028856), the content of which is incorporated herein by reference.

INDUSTRIAL APPLICABILITY

As to a coated cutting tool according to the present invention, such coated cutting tool has excellent wear resistance and fracture resistance, so that the tool life can be extended more than that involved in the prior art, and, from such perspective, the coated cutting tool has industrial applicability.

REFERENCE SIGNS LIST

1 Substrate
2 Lowermost layer
3 TiCN layer
4 Intermediate layer
5 α-type aluminum oxide layer
6 Outermost layer
7 Coating layer
8 Coated cutting tool

What is claimed is:

1. A coated cutting tool comprising a substrate and a coating layer formed on a surface of the substrate, the coating layer comprising at least one α-type aluminum oxide layer, wherein:
   in the α-type aluminum oxide layer, a texture coefficient TC (0,0,12) of a (0,0,12) plane represented by formula (1) below is from 4.0 or more to 8.4 or less;
   a residual stress value in a (1,1,6) plane of the α-type aluminum oxide layer is from −600 MPa or higher to −300 MPa or lower;
   the coating layer comprises a titanium carbonitride layer between the substrate and the α-type aluminum oxide layer;
   a residual stress value in a (4,2,2) plane of the titanium carbonitride layer is from 0 MPa or higher to 400 MPa or lower; and
   a residual stress value in a (4,0,10) plane of the α-type aluminum oxide layer is from 0 MPa or higher to 300 MPa or lower $$TC(0, 0, 12) = \frac{I(0, 0, 12)}{I_0(0, 0, 12)} \left\{ \frac{1}{9} \sum \frac{I(h, k, l)}{I_0(h, k, l)} \right\}^{-1} \quad (1)$$

(In formula (1), I (h,k,l) denotes a peak intensity for an (h,k,l) plane in X-ray diffraction of the α-type aluminum oxide layer, $I_0$ (h,k,l) denotes a standard diffraction intensity for an (h,k,l) plane which is indicated on a JCPDS Card No. 10-0173 for α-type aluminum oxide, and (h,k,l) refers to nine crystal planes of (0,1,2), (1,0,4), (1,1,0), (1,1,3), (1,1,6), (0,1,8), (2,1,4), (3,0,0) and (0,0,12).

2. The coated cutting tool according to claim 1, wherein the coating layer satisfies a condition represented by formula (A) below $$0 \leq |S1 - S2| \leq 400 \quad (A)$$

(In formula (A), S1 denotes a residual stress value (unit: MPa) in a (4,0,10) plane of the α-type aluminum oxide layer, and S2 denotes a residual stress value (unit: MPa) in a (4,2,2) of the titanium carbonitride layer.

3. The coated cutting tool according to claim 1, wherein an average thickness of the titanium carbonitride layer is from 1.0 μm or more to 20.0 μm or less.

4. The coated cutting tool according to claim 1, wherein the coating layer comprises, between the titanium carbonitride layer and the α-type aluminum oxide layer, an intermediate layer comprising a compound of at least one kind selected from the group consisting of a Ti carboxide, a Ti oxynitride and a Ti carboxynitride.

5. The coated cutting tool according to claim 4, wherein an average thickness of the intermediate layer is from 0.1 μm or more to 1.5 μm or less.

6. The coated cutting tool according to claim 1, wherein, in the α-type aluminum oxide layer, the texture coefficient TC (0,0,12) is from 5.0 or more to 8.2 or less.

7. The coated cutting tool according to claim 1, wherein a residual stress value in a (4,0,10) plane of the α-type aluminum oxide layer is, in at least part thereof, from 0 MPa or higher to 200 MPa or lower.

8. The coated cutting tool according to claim 1, wherein an average thickness of the α-type aluminum oxide layer is from 1.0 μm or more to 15.0 μm or less.

9. The coated cutting tool according to claim 1, wherein an average thickness of the coating layer is from 3.0 μm or more to 30.0 μm or less.

10. The coated cutting tool according to claim 1, wherein the coating layer comprises a TiN layer as an outermost layer on the α-type aluminum oxide layer.

11. The coated cutting tool according to claim 1, wherein the substrate is comprised of any of a cemented carbide, cermet, ceramics and a sintered body containing cubic boron nitride.

12. The coated cutting tool according to claim 2, wherein an average thickness of the titanium carbonitride layer is from 1.0 μm or more to 20.0 μm or less.

13. The coated cutting tool according to claim 2, wherein the coating layer comprises, between the titanium carbonitride layer and the α-type aluminum oxide layer, an intermediate layer comprising a compound of at least one kind selected from the group consisting of a Ti carboxide, a Ti oxynitride and a Ti carboxynitride.

14. The coated cutting tool according to claim 3, wherein the coating layer comprises, between the titanium carbonitride layer and the α-type aluminum oxide layer, an intermediate layer comprising a compound of at least one kind selected from the group consisting of a Ti carboxide, a Ti oxynitride and a Ti carboxynitride.

* * * * *